(12) United States Patent
Tong et al.

(10) Patent No.: US 12,212,292 B2
(45) Date of Patent: Jan. 28, 2025

(54) DEVICES AND METHODS INVOLVING POWER-AMPLIFICATION ARCHITECTURE USING T-NETWORK

(71) Applicant: The Board of Trustees of the Leland Stanford Junior University, Stanford, CA (US)

(72) Inventors: Zikang Tong, Stanford, CA (US); Lei Gu, Stanford, CA (US); Juan Rivas-Davila, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 544 days.

(21) Appl. No.: 17/487,968

(22) Filed: Sep. 28, 2021

(65) Prior Publication Data

US 2022/0103141 A1    Mar. 31, 2022

Related U.S. Application Data

(60) Provisional application No. 63/085,724, filed on Sep. 30, 2020.

(51) Int. Cl.
*H03F 1/14*    (2006.01)
*H03F 1/56*    (2006.01)
(Continued)

(52) U.S. Cl.
CPC ............ *H03F 3/245* (2013.01); *H03F 1/565* (2013.01); *H04B 1/40* (2013.01); *H03F 2200/09* (2013.01);
(Continued)

(58) Field of Classification Search
CPC ...... H03F 3/245; H03F 1/565; H03F 2200/09; H03F 2200/171; H03F 2200/453;
(Continued)

(56) References Cited

U.S. PATENT DOCUMENTS 5,327,337 A    7/1994   Cripe
7,202,734 B1   4/2007   Raab
(Continued)

OTHER PUBLICATIONS

A. S. Jurkov, A. Radomski and D. J. Perreault, "Tunable Matching Networks Based on Phase-Switched Impedance Modulation1," in IEEE Transactions on Power Electronics, vol. 35, No. 10, pp. 10150-10167, Oct. 2020.
(Continued)

*Primary Examiner* — Khanh V Nguyen
(74) *Attorney, Agent, or Firm* — Crawford Maunu PLLC

(57) ABSTRACT

In certain examples, the disclosure involves or is directed to a circuit-based apparatus that has a T-network, and a plurality of circuit paths with a first path having a first switching node to respond to an RF input signal that is characterized by a first phase, and with a second path having a second switching node to respond to the RF input signal characterized by a second phase that is different than the first phase. The circuit paths may be configured as a push-pull amplification circuit. The T-network may be arranged between the first and second switching nodes and may include a variable impedance circuit. The variable impedance circuit may be adjusted, in accordance with a selected frequency of the RF input signal. The T-network may be characterized by a resonance frequency shunts a second harmonic current associated with the resonance frequency, thereby permitting for use of different selected frequencies.

20 Claims, 5 Drawing Sheets

(51) Int. Cl.
*H03F 3/24* (2006.01)
*H04B 1/40* (2015.01)

(52) U.S. Cl.
CPC .. *H03F 2200/171* (2013.01); *H03F 2200/453* (2013.01)

(58) Field of Classification Search
CPC ...... H03F 2200/451; H03F 3/189; H03F 3/30; H04B 1/40
See application file for complete search history.

(56) References Cited

U.S. PATENT DOCUMENTS

| | | | | |
|---|---|---|---|---|
| 8,058,927 B2* | 11/2011 | Potscher | ................. | H03K 7/02 330/10 |
| 9,923,518 B2 | 3/2018 | Perreault et al. | | |
| 10,476,451 B2* | 11/2019 | Guo | .................... | H03F 3/45179 |
| 2009/0184761 A1* | 7/2009 | Reynaert | ................. | H03F 3/245 330/10 |
| 2019/0020313 A1 | 1/2019 | Perreault et al. | | |

OTHER PUBLICATIONS

Wen-Jian Gu and K. Harada, "A new method to regulate resonant converters," in IEEE Transactions on Power Electronics, vol. 3, No. 4, pp. 430-439, Oct. 1988.

L. Gu, G. Zulauf, Z. Zhang, S. Chakraborty and J. Rivas-Davila, "Push-Pull Class $\phi$ 2 RF Power Amplifier," in IEEE Transactions on Power Electronics, vol. 35, No. 10, pp. 10515-10531, Oct. 2020. Filed as Appendix B of the priority U.S. Appl. No. 63/085,724.

Z. Tong, L. Gu and J. Rivas-Davila, "Wideband PPT Class $\phi$ 2 Inverter using Phase-Switched Impedance Modulation and Reactance Compensation," in IEEE Transactions on Industrial Electronics, 11 pages, Jun. 24, 2021. Filed as an Appendix of the instant U.S. Patent Application filed Sep. 28, 2021.

* cited by examiner

DEVICES AND METHODS INVOLVING POWER-AMPLIFICATION ARCHITECTURE USING T-NETWORK

BACKGROUND

Aspects of the present disclosure are directed to power amplifiers for amplifying signals with such amplifiers being used, among a variety of different contexts, in connection with resonant inverters or inverter architectures.

In many systems that support modern circuit-based systems, including from cellphones, radio-frequency (RF) equipment and systems to medical equipment such as Magnetic Resonance Imaging (MRI) and particle accelerators, power amplifiers may play an important role. Switched-mode power amplifiers can ideally offer close-to-unity efficiency, which makes them attractive for energy-hungry radio-frequency and microwave applications. By operating the active device as a switch rather than a controlled current source, the overlap between the voltage and current can be mitigated to reduce frequency-dependent switching losses.

In the above and other systems and devices, there have been many types of designs involving switched-mode power amplifiers. In a Class E amplifier, for example, the voltage across the active device resonantly rings down to zero before the active device is switched on. Such zero-voltage switching (ZVS) operation may avoid the loss of the energy stored in the parasitic capacitance across the main junction of the active device. Besides ZVS operation in a Class E circuit, the current flowing through the active device is zero when it is switched on, which causes the rate of the voltage change across the parasitic capacitance also to be zero. This is called zero voltage derivative switching (ZVDS) operation.

Certain of the above-mentioned systems, as radio-frequency (RF) broadcasting and semiconductor plasma processing, demand a power amplifier or power inverter capable of generating hundreds to thousands of watts in the form of ac power in the tens of MHz over a certain bandwidth. However, in many known systems of this type, the power amplifiers or power inverters ("power converters") capable of generating such power are designed to operate at a specific frequency. For example, with such known power converters the efficiency and/or power levels can drastically fluctuate when the operation occurs outside the nominal frequency, which leads to certain types of disadvantageous mitigation designs such as large heatsinks or multiple power amplifier stages, each operating at a different frequency.

These and other matters have presented challenges to power amplifier designs and implementations, for a variety of applications including but not limited to those noted above and discussed hereinbelow.

OVERVIEW/SUMMARY OF VARIOUS ASPECTS AND EXAMPLES

Various examples/embodiments presented by the present disclosure are directed to issues such as those addressed above and/or others which may become apparent from the following disclosure. For example, some of these disclosed aspects are directed to methods and devices that use or leverage from power-amplifier and/or resonant-inverter architectures for effecting an efficient and/or constant production of output power over multiple input signal frequencies and/or over a range of input signal frequencies.

Other specific aspects are directed to overcoming previously-used techniques, such as discussed above. For example, certain of these aspects involve a resonant inverter (or inverter architecture) which overcomes such issues by achieving constant power and efficiency over a relatively large bandwidth spanning multiple input signal frequencies or a range of frequencies. In one such example, the bandwidth is defined over a range that is limited by the variable design constraints of variable impedance circuitry used to define and set a variable resonance frequency of the power amplifier. In other embodiments and/or more specific embodiments than those mentioned above, such inverters may be single-stage.

In one specific circuit-based embodiment, an apparatus includes: a plurality of circuit paths including a first path having a first switching node to respond to an RF input signal that is characterized by a first phase, and a second path having a second switching node to respond to the RF input signal characterized by a second phase that is different than the first phase; and a T-network. The T-network is electrically arranged between the first and second switching nodes and may include a variable impedance circuit. The variable impedance circuit may be adjusted, in accordance with a selected frequency of the RF input signal. The T-network may be characterized by a resonance frequency that is to shunt a second harmonic current associated with the resonance frequency, wherein the T-network and the plurality of circuit paths form an amplifier circuit to amplify the RF input signal.

In another specific circuit-based embodiment, an apparatus is directed to push-pull amplification circuitry to be driven at one or more selected frequencies by out-of-phase input signals, and a T-network that is coupled to the push-pull circuitry and that may include a variable impedance circuit which can be adjusted in accordance with the one or more selected frequencies. The adjustment of the variable impedance circuit is made such that a resonance frequency of the T-network is to shunt a second harmonic current associated with the resonance frequency.

In another specific example, the present disclosure is directed to a circuit-amplification method which involves a semiconductor device having push-pull amplification circuitry and a T-network coupled to the push-pull circuitry, The method may include driving the push-pull amplification circuitry at one or more selected frequencies by out-of-phase input signals and adjusting or changing a variable impedance circuit as part of the T-network to alter, in accordance with the one or more selected frequencies, a resonance frequency associated with the T-network and cause a second harmonic current associated with the resonance frequency to be shunted. Depending on the application and/or specific example, the step of driving may occur before the step of adjusting, the step of driving may occur after the step of adjusting, and/or the step of driving may occur concurrently with the step of adjusting.

Other specific aspects and examples, related to the above examples and in some instances building on the above aspects and examples, should become apparent from the discussion and claims which follow.

The above discussion is not intended to describe each aspect, embodiment or every implementation of the present disclosure. The figures and detailed description that follow also exemplify various embodiments.

BRIEF DESCRIPTION OF FIGURES

Various example embodiments, including experimental examples, may be more completely understood in consideration of the following detailed description in connection with the accompanying drawings, each in accordance with the present disclosure, in which.

Figure 1:
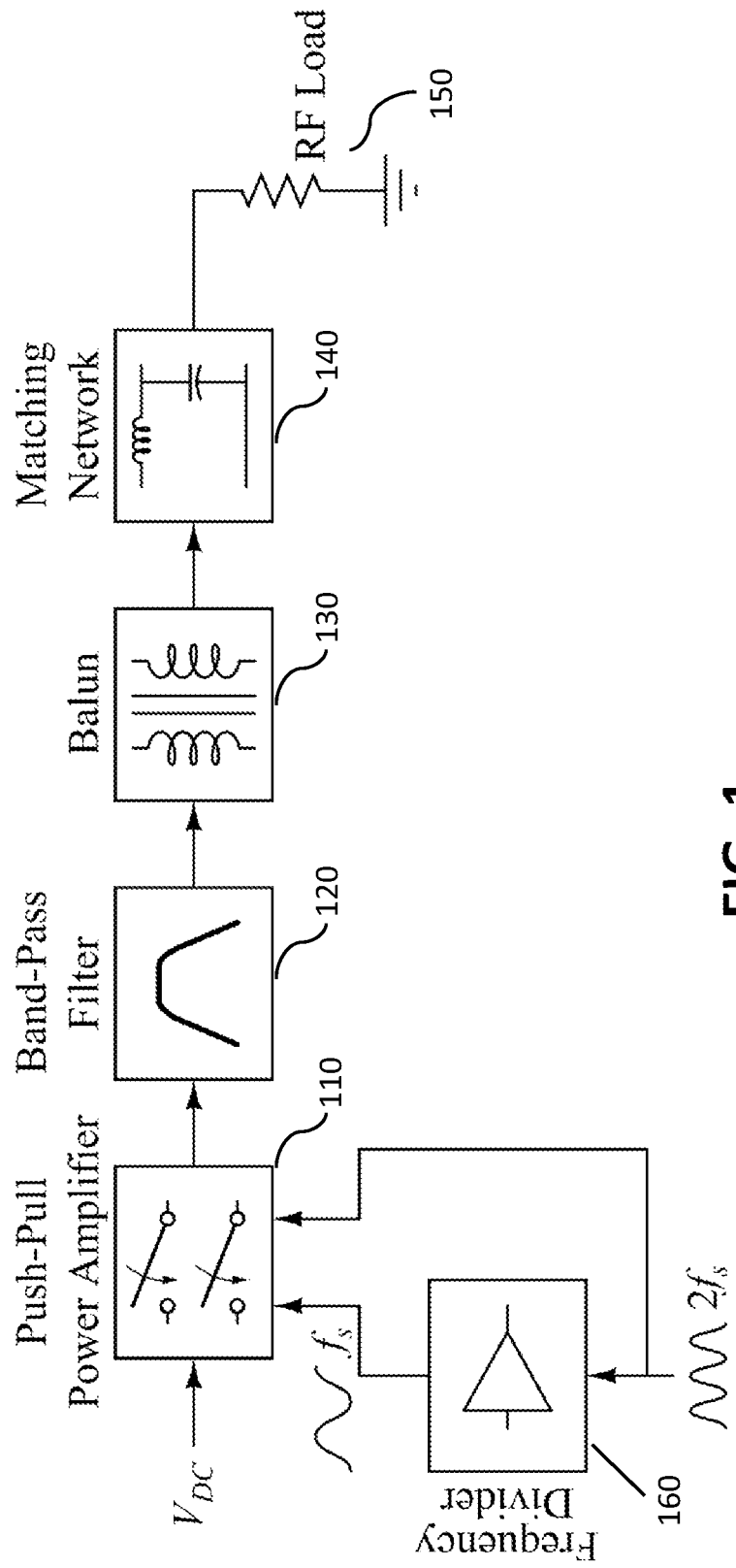
FIG. 1 is an example block diagram of a resonant inverter according to the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Exemplary aspects of the present disclosure are believed to be applicable to a variety of different types of apparatuses (e.g., systems, devices, circuits, etc.) and methods involving circuitry characterized at least in part by T-network as used in a signal amplifier. In certain illustrated examples, the circuit paths integrated with the signal amplifier may be configured as a push-pull amplification circuit, and the T-network may be characterized by a resonance frequency shunts a second harmonic current associated with the resonance frequency, thereby permitting for use of different selected input frequencies. While the present disclosure is not necessarily limited to such aspects or examples, an understanding of specific examples in the following description may be understood from discussion in such specific contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same connotation and/or reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Exemplary aspects of the present disclosure are perhaps best understood by considering various specific circuit-based embodiments which, as noted previously, may have a variety of applications. One such apparatus includes a plurality of circuit paths with a first path having a first switching node to respond to an RF input signal that is characterized by a first phase, and with a second path having a second switching node to respond to the RF input signal characterized by a second phase that is different than the first phase; and a T-network. As an example, the first and second phases may be 180 degrees out of phase. The T-network may be electrically arranged between the first and second switching nodes and may include a variable impedance circuit. In more specific aspects, the variable impedance circuit may be adjusted, in accordance with a selected frequency of the RF input signal, and the T-network may be associated with a resonance frequency with the circuitry of the T-network configured to shunt a second harmonic current of the resonance frequency.

Other related example specific embodiments may relate to the above aspects and/or may build on such aspects. In one such related example, the above type of embodiment may be changed to accommodate more than two circuit paths and related phases of the input signal(s). More particularly, such an example may have such circuit paths including first, second and third circuit paths respectively associated with a three-phase signal driving transistors in each such respective circuit path out-of-phase with one another by 120 degrees.

In another specific circuit-based embodiment, an apparatus is directed to push-pull amplification circuitry to be driven at one or more selected frequencies by out-of-phase input signals, and a T-network that is coupled to the push-pull circuitry and that may include a variable impedance circuit which can be adjusted in accordance with the one or more selected frequencies. The adjustment of the variable impedance circuit is made such that a resonance frequency of the T-network is to shunt a second harmonic current associated with the resonance frequency.

Another specific example of the present disclosure is similarly directed to a circuit-amplification method which involves a semiconductor device having such push-pull amplification circuitry and T-network circuitry coupled to the push-pull circuitry. The method may include driving the push-pull amplification circuitry at one or more selected frequencies by out-of-phase input signals and adjusting or changing a variable impedance circuit as part of the T-network to alter, in accordance with the one or more selected frequencies, a resonance frequency associated with the T-network and cause a second harmonic current associated with the resonance frequency to be shunted. Depending on the application and/or specific example, the step of driving may occur before the step of adjusting, the step of driving may occur after the step of adjusting, and/or the step of driving may occur concurrently with the step of adjusting.

As other specific examples related to the above methodology and/or devices, aspects of various embodiments in the present disclosure are directed to apparatuses, systems, methods of use, and methods of manufacture of such apparatuses, such as those in the claims, description and/or the figures included herewith and, in certain instances, as may be applied and understood as discussed in the Appendix B (supplementation entitled, "Push-Pull Class Φ2 RF Power Amplifier"), which forms part of the U.S. Provisional Application Ser. No. 63/085,724 as filed on Sep. 30, 2020, and which this patent document relies on and claims for priority benefit.

Certain more-specific and/or other example aspects and embodiments of the present disclosure are directed to such an apparatus (e.g., a device or a system) and/or methods of using such an apparatus having circuitry wherein the T-network is to be driven at one or more selected frequencies by a multiple phase (out-of-phase) input signal, and is to be configured with circuitry that is associated with a resonant frequency that can be adjusted with changes in the one or more selected frequencies.

In yet further related examples, one or more of the above-characterized specific embodiments may involve a power amplifier having push-pull amplification circuitry, driven at a certain (e.g., adjustable) frequency by out-of-phase signals, and having T-network circuitry associated with a resonant frequency. In one such related yet more-specific approach, the T-network circuitry includes components associated with and setting the resonant frequency by way of at least one inductor and at least one capacitor, and with at least one of these components being variable to adjust the resonant frequency. Circuitry in the T-network may be variable and implemented, for example, using 2 inductors and 1 capacitor, or using the vertical/shunting part of the T-network implemented with one type of impedance (inductive or capacitive) and the two horizontal/top parts of the T-network implemented with the other type of impedance.

Figure 2:
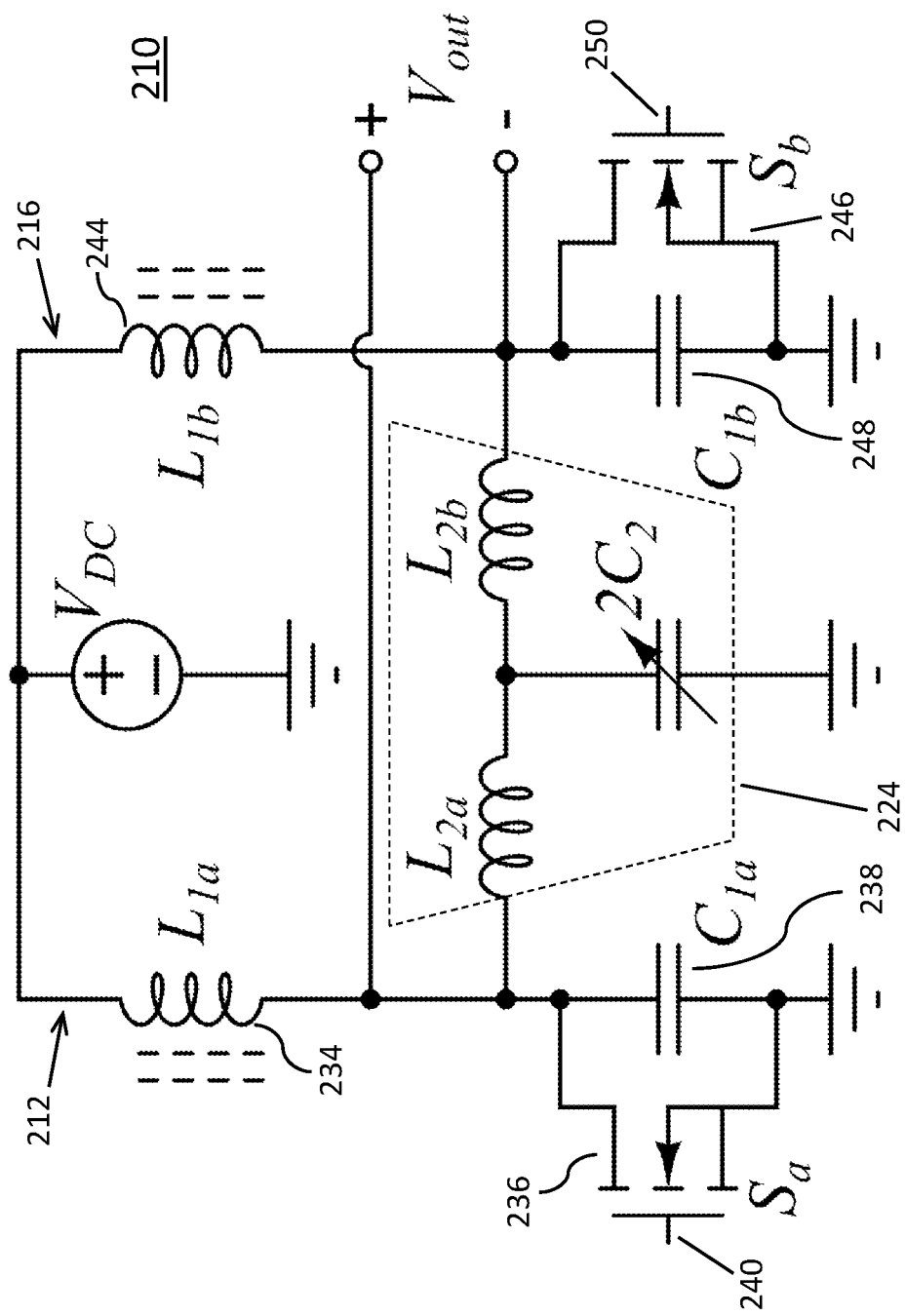
FIG. 2 is an example power amplifier circuit, according to the present disclosure, with a single stage shown as a push-pull class-ef2 circuit which uses such a T-network a variable capacitance circuit.

In a more specific embodiment of this type, the power amplifier stage is a push-pull (e.g., class-ef2 circuit) which uses such a T-network arranged to provide zero-voltage-switching for the power amplifier as well as shunt the second harmonic current, which shapes the voltage waveform across switches of the power amplifier (see, e.g., FIG. 2 with FET switches 236 (Sa) and 246 (Sb).

In related yet more specific aspects, the present disclosure is directed to a power amplifier that may have the push-pull amplification circuitry driven at the one or more selected frequencies using a frequency-divider circuit and/or by out-of-phase signals, and with circuitry associated with a resonant frequency that can be adjusted with changes in the one or more selected frequencies. Also, by using such a frequency-divider circuit, a signal-phase signal may be converted into a pair of signals, each out-of-phase and switching at the selected variable one of the multiple frequencies. In another aspect, the pair of signals may be used to control and/or adjust an impedance for setting the adjustable resonant frequency.

Further, certain exemplary power converters according to the present disclosure may be configured to provide efficiency levels and/or power levels that are controlled (e.g., as opposed to being permitted to fluctuate significantly such as on the order of more than 5% or 7%, in some cases more than 10% and in other cases more than 15 or 20%), when the operation occurs outside of a certain nominal or default (e.g., set-up) frequency. In more specific implementations, such power converters according to the present disclosure may be configured to avoid the need for overly-large heatsinks and/or the need for multiple power amplifier stages, each operating at a different frequency.

A more specific example embodiment of the present disclosure is directed to an apparatus which uses a single-stage resonant inverter architecture configured to provide constant power and efficiency levels over a large (e.g., selectable) frequency bandwidth. For example, where a certain bandwidth may be associated with a point of resonance defined by the push-pull power amplifier stage, for applications that require the frequency of the RF power to be adjusted, constant power and/or high efficiency levels may be realized over a large bandwidth.

Consistent with the present disclosure and in various non-limiting examples, aspects of the present disclosure may be directed to apparatuses and their uses being associated with specific (non-limiting) exemplary applications such as RF transmissions, RF broadcasting, semiconductor plasma processing where power demands may be significant, and/or other applications where such applications may find benefit by a power amplifier or power inverter capable of generating hundreds to thousands of watts (e.g., in the form of AC power in a frequency range or ranges characterized by Megahertz (MHz) notation such as 0.1 MHz to 200 MHz), or in the tens of MHz (e.g., 20 MHz to 200 MHz) over a certain bandwidth which bandwidth may be controlled via an adjustability aspect. Depending on the example embodiment, such ranges may be limited by the particular design of the variable impedance circuitry and/or, if used, a bandpass (or band-limiting) frequency filter coupled to the output of the resonant inverter or power amplification circuitry. Further, depending on the application, such a bandwidth may be adjustable by using a control circuit (e.g., analog/digital logic circuitry such as a microcontroller, hard-wired/clippable selector circuit, and/or a microcomputer) with an output for that controls one or more subcircuits or components of the resonant inverter (or inverter architecture) and/or band-limiting filter circuit.

In certain of the example embodiments discussed and/or illustrated herein, the skilled artisan would appreciate that such amplification circuitry may operate relative to a resonant frequency as set by the above-noted variable resonance circuitry, or as a resonant inverter, so as to provide a constant power level and/or constant level of efficiency over a fixed or (adjustably) variable bandwidth. Depending on the example, the bandwidth may or may not be associated with or correspond to use of a band-pass filter or any specific leg/component of the variable resonance circuitry.

Turning now to the drawing, FIG. 1 is an example block diagram of a resonant inverter, according to the present disclosure, which in some instances may be used as a wideband resonant inverter. More specifically, the illustrated example block diagram exemplifies one of many applicable architectures, with this type of architecture illustrated as featuring a push-pull power amplifier stage 110 driving a bandpass filter 120. Depending on the design for such an example embodiment, the frequency range of the bandpass filter 120 may be associated with and/or limited by the particular design of a variable impedance circuitry which is in the amplifier stage 110. Acting as a band-limiting frequency circuit, the bandpass filter 120 is coupled to the output of the resonant inverter or power amplification circuitry, so that only one or more (e.g., a selected range of) frequencies as selected in connection with a setting of the variable impedance circuitry, is passed.

Following the bandpass filter 120 in this illustrated example, in series are a balun 130 and a matching network stage 140. The balun 130 may be included, as may or may not be applicable, to convert between a balanced signal and an unbalanced signal and/or transform impedances of the high-frequency signal being passed by the balun. The matching network stage 140 may be similarly configured to match the signal passing through the balun 130 to the loading circuitry 150 (e.g., an RF load terminating say at 50 Ohms).

Inputs to the amplifier stage 110 of FIG. 1 include a DC (direct current) voltage source and at least two out-of-phase signals of a certain frequency, depicted as $f_s$. According to certain more-specific examples, a variable capacitor (or an impedance-varying circuit) may be used so that the resonant frequency of the T-network is adjusted as the frequency of the input signal changes. Adjustment of the variable circuitry (e.g., variable capacitor) may be such that the second harmonic current of the resonance frequency is shunted via the T-network. In particular example implementations, the variable circuitry of the T-network uses a switched-capacitor array and/or a phase-switched impedance modulation (PSIM) circuit as is known (see, e.g., U.S. Patent Publication No. 2019/0020313), incorporated by reference specifically for disclosure of circuitry showing tunable impedance-matching network(s).

As an example for how proper gate signals to drive the FETs or circuits of each of the circuit paths between the voltage source and common, a frequency-divider circuit 160 may be used. The frequency-divider circuit 160 may be used to convert its received input signal of frequency $2f_s$, into two out-of-phase signals of frequency $f_s$, each being 180 degrees out of phase. In addition, in connection an example in which a PSIM is used, the $2f_s$ signal can be used to adjust the variable impedance component/circuitry (such as the capacitance or inductance) within the T-network.

FIG. 2 is an example power-amplifier circuit 210, according to the present disclosure, with a single stage shown as a push-pull (e.g., class-ef2) circuit which uses such a T-network having a variable capacitance circuit. The power-amplifier circuit 210 includes two circuit paths 212 and 216, each associated with various circuits arranged in series between a voltage source VDC and ground (or common). Each of the circuit paths 212 and 216 includes an inductor 234/244 that is coupled to the other inductor 244/234; and a drive circuit in the exemplary form of a FET 236/246, and further includes a capacitor 238/248 (equally-valued $C_{1a}$, $C_{1b}$) which couples the circuit path 212/216 to ground.

In operation, input ports (e.g., at gates 240 and 250) are driven by a multiple-phase signal which has two out-of-phase aspects as discussed above. The power-amplifier circuit 210 also includes a T-network which provides a variable-impedance circuit 224. In this particular example, the variable-impedance circuit 224 has a two equally-valued inductors ($L_{2a}$ and $L_{2b}$) on opposite legs of the top of the T-network and a capacitor $2_{C2}$ for implementing the vertical leg of the T-network. In this specific example, the value of the capacitor $2_{C2}\backslash$ may be twice the value of each of the equally-valued capacitors ($C_{1a}$, $C_{1b}$) which couples the each of the circuit paths 212 and 216 to ground.

As illustrated, the exemplary power amplifier stage may be a push-pull (class-ef2) circuit which uses a T-network of 2 inductors and 1 capacitor. The T-network is used to provide zero-voltage-switching for the power amplifier as well as shunt the second harmonic current, which shapes the voltage waveform across the switches. Detailed explanations and design procedures are provided in examples as in Appendix B of the underlying U.S. Provisional Application.

Figure 3:
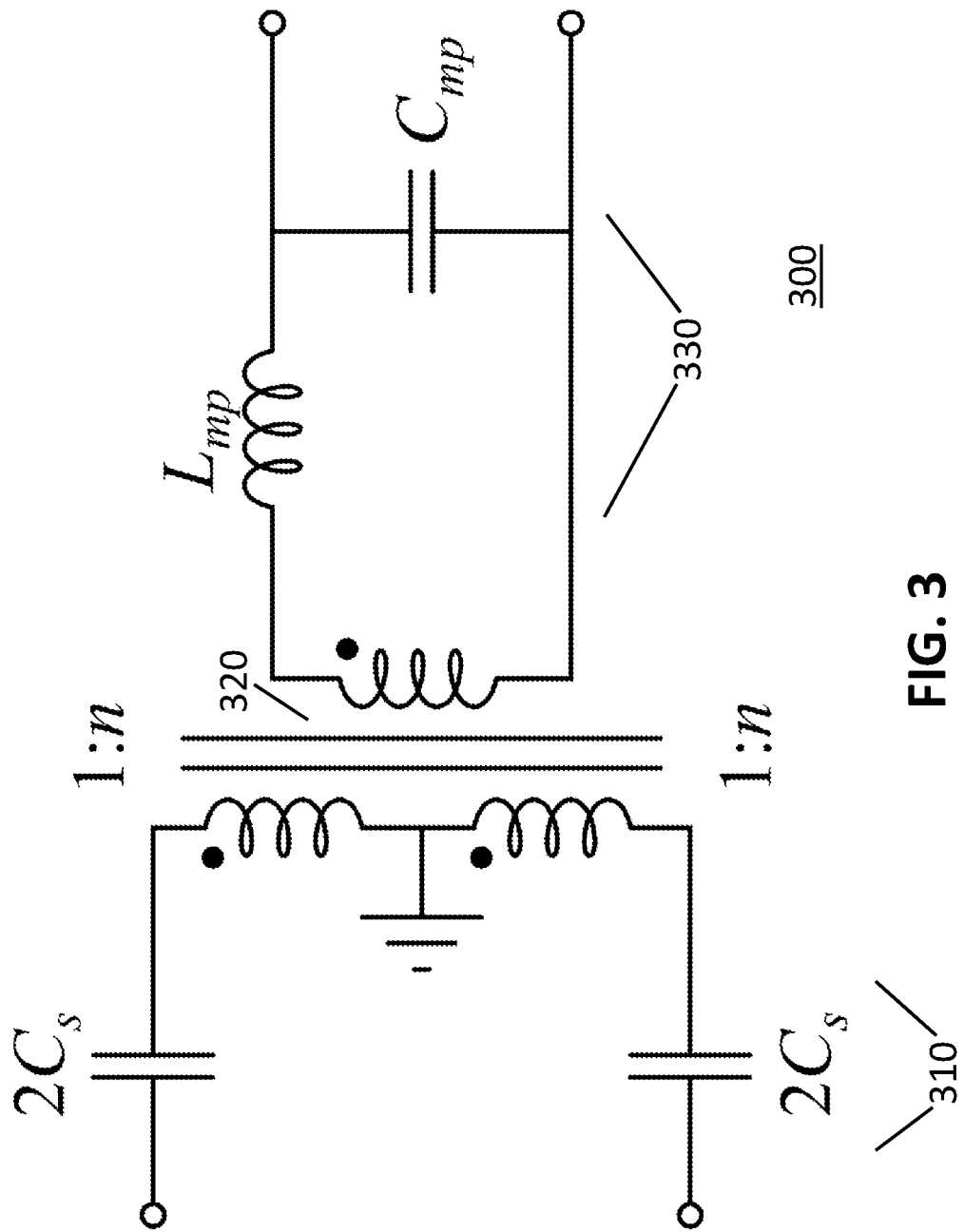
FIG. 3 is a diagram of an example load network, also according to the present disclosure, which may be used with aspects of one or more of the above-discussed aspects of the present disclosure.
Figure 4:
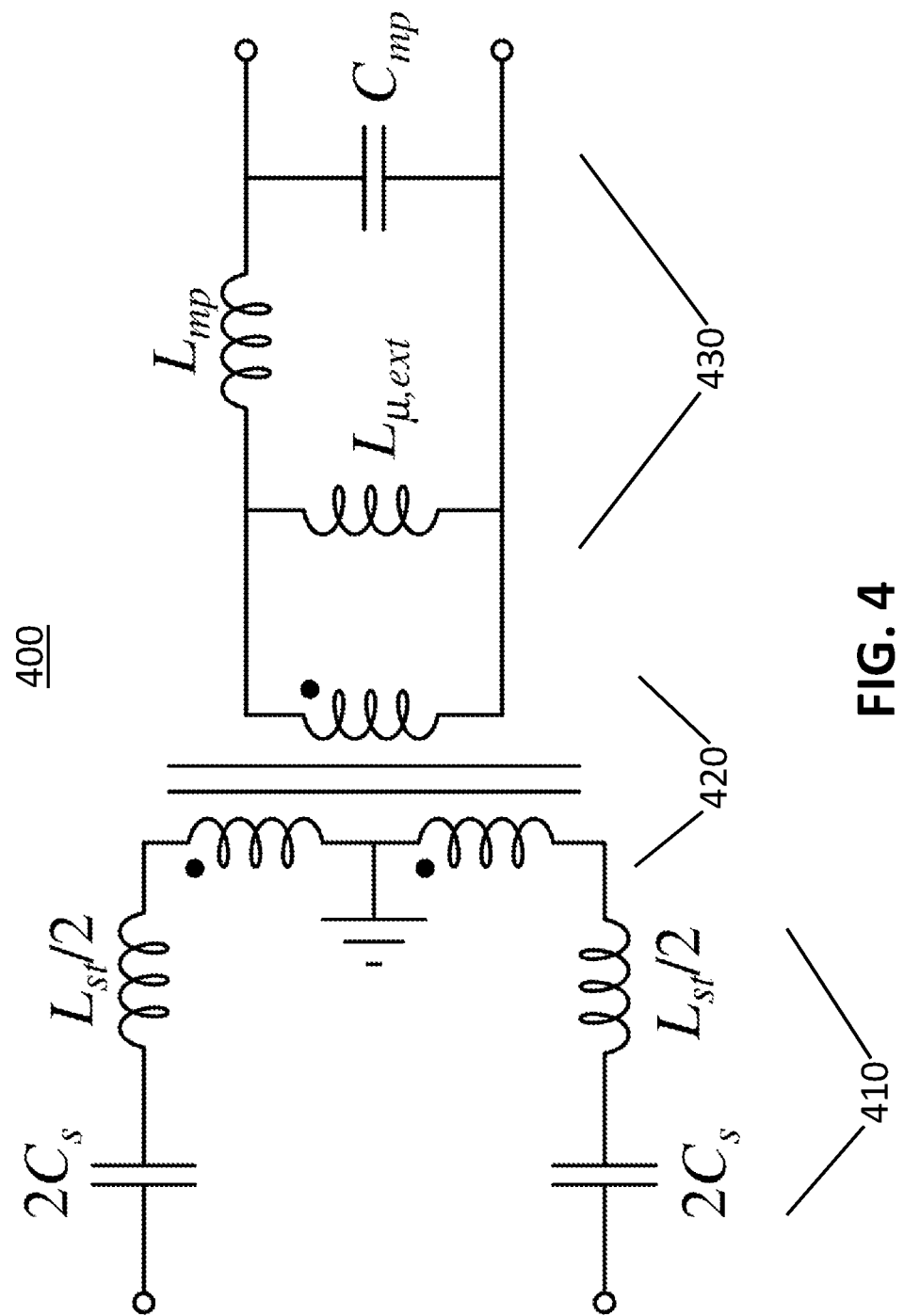
FIG. 4 is a diagram of an alternative example load network, also according to the present disclosure, which may be used with aspects of one or more of the above-discussed aspects of the present disclosure.

Referring to the first of the alternative circuits respectively shown in FIGS. 3 and 4, FIG. 3 is a diagram of an example load network, also according to the present disclosure, which may be used with aspects such as the above-discussed blocks depicted as the bandpass filter 120, the balun 130, and the matching network 140 of FIG. 1. FIG. 3 shows how these blocks can be compressed and combined into one more-integrated circuit structure having significantly fewer components. As the bandpass filter 120 is to allow RF power of frequencies within the bandwidth to be passed, the circuit of FIG. 3 shows that this operation may be achieved through a high-pass stage 310 with 2Cs and the center-tapped transformer 320, and through magnetizing inductance being cascaded with a low-pass stage 330 via impedance components/circuitry $L_{mp}$ and $C_{mp}$. The center-tapped transformer 320 may also serve the operation(s) of a balun by converting the differential voltage from the push-pull amplifier to a ground-referenced signal. The circuit structure of FIG. 3 may also provide matching from any of a variety of high impedance loads to a lower impedance load. The transformer may have a turns ratio that can provide the appropriate impedance transformation and the inductive-networks (L-networks) of the bandpass filter may also be configured to transforms from high to low impedances. Thus, the combined and integrated structure may serve as a three-stage matching network with only two capacitors, one transformer, and one inductor.

In certain cases, it may be difficult to quickly implement a transformer with a well-controlled-turns ratio and magnetizing inductance with minimal leakage. In this regard, the circuitry shown in FIG. 3 may be considered as a simplified load network where the components shown in FIG. 4 may be considered for such a load network with realistic components. As indicated by the alternative circuit 400 of FIG. 4 which may have a similarly-configured center-tapped transformer 420, such optimization may be realized by way of one or more additional inductors in the high-pass stage 410 (associated with the high-pass stage 310) and/or in the low-pass stage 430 (associated with the low-pass stage 330). In the high-pass stage 410, one or more additional inductors $L_{st/2}$ may arranged in-series and in one or respective opposing legs of the input (primary) side of the center-tapped transformer 420. In the low-pass stage 430, an additional shunting inductor $L_{u,ext}$ may be arranged across the output (secondary) side of the center-tapped transformer 420. Values of such inductive components can be found by trial and error and fine-tuned and compensated by way of additional inductors.

The circuit structure 300 of FIG. 3 is to provide another important aspect for such a variable or wideband converter. At the nominal frequency, the impedance seen at the input of the network is purely resistive with no reactance. At higher frequencies, the reactance of the network increases positively, while the resistance negligibly changes. At lower frequencies, the reactance decreases negatively, with nearly constant resistance. This aspect allows the power amplifier stage to achieve zero-voltage switching and near zero-derivative-voltage-switching, which helps to minimize switching loss and circulating current throughout the converter. Thus, this network helps the wideband circuit to achieve high efficiency as well.

Figure 5:
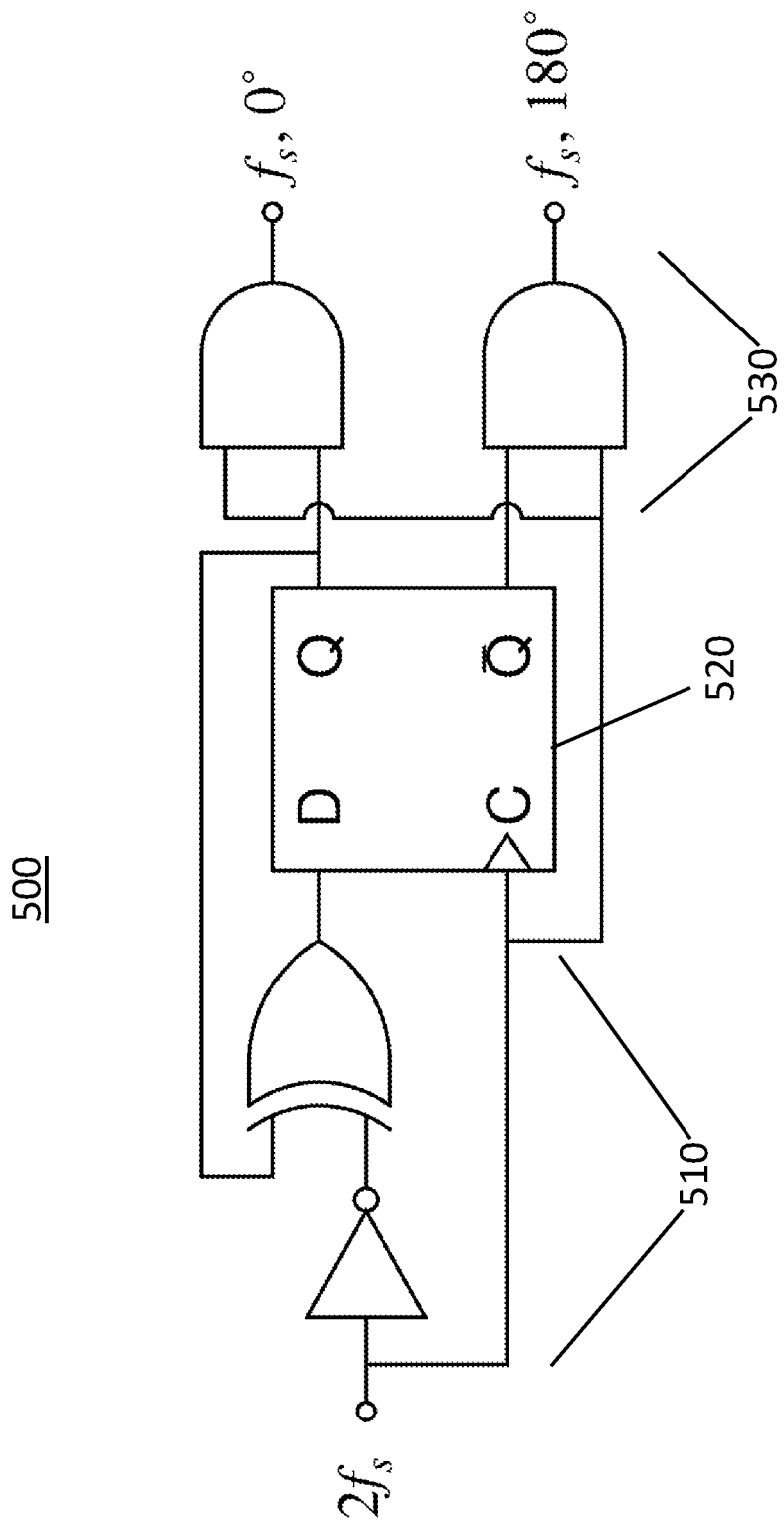
FIG. 5 is a diagram of an example frequency divider circuit, also according to the present disclosure, which may be used with aspects of one or more of the above discussed aspects of the present disclosure.

FIG. 5 is a diagram of an example frequency-divider circuit 500, also according to the present disclosure, which may be used with aspects of one or more of the above discussed aspects of the present disclosure. The frequency-divider circuit 500 receives an input signal $2f_s$ at front-end logic circuitry 510 (e.g., inverter and EXOR gates) which, in turn is used to drive the D-input and clock ports of a flip-flop circuit 520. Outputs of the flip-flop circuit 520 drive (NAND) backend logic 530 to generate the out-of-phase signals $f_s$ at zero degrees and $f_s$ at 180 degrees. Consistent with the examples of FIGS. 1 and 2, the example frequency-divider circuit 500 may be used to drive certain of the above-discussed variations of a push-pull amplification circuitry. Various types of logic/programmable circuits may be used for providing control over the type of circuit being used to provide the input signal for driving the push-pull amplifier inputs (e.g., such as at the input of FIG. 5 or alternatively, at nodes connected where the outputs of FIG. 5 might otherwise connect). Such logic/programmable circuits may also be used for providing control over the selectable bandwidth and/or impedance, for example, via such a variable capacitor as discussed above and/or in connection with FIG. 2. In more specific examples relating to the above-described aspects, such logic/programmable circuits may involve a computer program product (e.g., non-volatile memory device), which includes a machine or computer-readable medium having stored thereon instructions which may be executed by a computer (or other electronic device) to perform these operations/activities. In certain such CPU-related embodiments, a programmable circuit may be used as one or more computer circuits, including memory circuitry for storing and accessing a program to be executed as a set (or sets) of instructions (and/or to be used as configuration data to define how the programmable circuit is to perform), and an algorithm or process as described above is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning. Further, as also should be apparent, a component (e.g., conductor, inductor) may be considered alone and/or in combination with other component(s), as circuitry.

In connection with various more-specific example embodiments involving experimental efforts, power amplifiers implemented in accordance with the present disclosure have doubles power output, have used simple design procedures, and have operated across wideband in some instances. In such instances, this has been realized with a single variable capacitor implemented through PSIM, wherein the switching stage of the circuitry (push-pull T-network with dual-phase inputs signal) may drive a reactance-compensating load network, thereby enabling the power amplifier to achieve wideband ZVS, harmonic filtering, multi-stage impedance matching, and power delivery to unbalanced loads. In certain related/experimental examples, the performance of the design in a 300 W system has been demonstrated with a nominal operation at 13.56 MHz and achieving over 90% efficiency across a 4 MHz bandwidth. For further details in connection with such experimental efforts, reference may be made to the attached Appendix (pp. 1-10), which forms part of the present disclosure and is fully incorporated herein by reference.

The skilled artisan would also recognize various terminology as used in the present disclosure by way of their plain meaning. As examples, the Specification may describe and/or illustrates aspects useful for implementing the examples by way of various semiconductor materials/circuits which may be illustrated as or using terms such as block, module, circuit path, device, system, unit, controller, and/or other circuit-type depictions. Also, in connection with such descriptions, the term "source" may refer to source and/or drain of a field-effect-transistor circuit used interchangeably as with the example FET-based circuitry of FIG. 2. Such semiconductor and/or circuit elements and/or related circuitry may be used together with other elements to exemplify how certain examples may be carried out in the form or structures, steps, functions, operations, activities, etc.

It is recognized and appreciated that as specific examples, the above-characterized figures and discussion are provided to help illustrate certain aspects (and advantages in some instances) which may be used in the manufacture of such structures and devices. These structures and devices include the exemplary structures and devices described in connection with each of the figures as well as other devices, as each such described embodiment has one or more related aspects which may be modified and/or combined with the other such devices and examples as described hereinabove may also be found in the Provisional. For example, based upon the above discussion and illustrations, those skilled in the art will also recognize that modifications and changes may be made to the various embodiments without strictly following the illustrated and described circuit or component arrangements herein. For example, methods as exemplified in the figures (e.g., as in the flow of FIG. 1) may involve steps carried out in various orders, with one or more aspects of the embodiments and/or individual aspects or parts therein retained, or may involve fewer or more steps as exemplified by the above discussed integration of circuits via FIG. 3 or FIG. 4. Also, as shown in FIGS. 2, 3 and 4, without departing from the true spirit and scope of various aspects of the disclosure, such modifications may include arrangements of impedance-based circuitry and components, and including specific circuit arrangements which are different than those as illustrated and/or discussed.

What is claimed:

1. An apparatus comprising:
    a plurality of circuit paths including a first path having a first switching node to respond to an RF input signal that is characterized by a first phase, and a second path having a second switching node to respond to the RF input signal characterized by a second phase that is different than the first phase; and
    a T-network arranged between the first and second switching nodes and including a variable impedance circuit to be adjusted in accordance with a selected frequency of the RF input signal, wherein the T-network is characterized by a resonance frequency that is to shunt a second harmonic current associated with the resonance frequency, wherein the T-network and the plurality of circuit paths form an amplifier circuit to amplify the RF input signal.

2. The apparatus of claim 1, wherein the first phase is 180 degrees out of phase relative to the second phase, and the first path and the second path are cooperatively arranged with a transistor as part of the first switching node and another transistor as part of the second switching node, and wherein the T-network and the plurality of circuit paths form a push-pull-type amplifier circuit.

3. The apparatus of claim 1, further including a bandpass filter coupled to an output of the amplifier circuit, and a control circuit to provide a control signal to adjust an impedance in the variable impedance circuit and therein adjust the resonance frequency.

4. The apparatus of claim 1, wherein the amplifier circuit is to operate as a resonant inverter that is to provide a constant power level and constant level of efficiency over a variable or adjustable bandwidth, wherein the variable bandwidth is associated with or corresponds to a bandpass filter.

5. The apparatus of claim 1, wherein the amplifier circuit is to operate as a resonant inverter that is to provide a constant power level over a variable or adjustable bandwidth, wherein the variable bandwidth is associated with or corresponds to one or more pass frequencies of a bandpass filter.

6. The apparatus of claim 1, further including loading circuitry electrically coupled between the first and second switching nodes.

7. The apparatus of claim 1, further including loading circuitry electrically coupled between the first and second switching nodes, wherein the loading circuitry includes at least one resistive component and at least one component from among types including: an inductor and a capacitor.

8. The apparatus of claim 1, wherein the T-network is at least in part characterized by a plurality of circuits forming the variable impedance circuit, the plurality of circuits including two series circuits interconnected at a junction that connects to a shunting circuit.

9. The apparatus of claim 8, wherein each of the two series circuits provides a magnitude of inductance, via an inductor or inductive circuit, and wherein the shunting circuit provides a magnitude of capacitance, via a capacitor or capacitive circuit.

10. The apparatus of claim 8, wherein each of the two series circuits provides a magnitude of capacitance, via a capacitor or capacitive circuit, and wherein the shunting circuit provides a magnitude of inductance, via a inductor or inductive circuit.

11. An apparatus comprising:
   push-pull amplification circuitry to be driven at one or more selected frequencies by out-of-phase input signals; and
   a T-network, coupled to the push-pull amplification circuitry and including a variable impedance circuit that includes a variable component to be adjusted in accordance with the one or more selected frequencies to set a resonance frequency of the T-network and to shunt a second harmonic current associated with the resonance frequency.

12. The apparatus of claim 11, wherein the push-pull amplification circuitry is to be driven at the one or more selected frequencies using a frequency-divider circuit.

13. The apparatus of claim 11, wherein the apparatus includes a frequency-divider circuit to drive the push-pull amplification circuitry at the one or more selected frequencies within a certain frequency range, and further includes a bandpass filter that is coupled to an output of an amplifier and that blocks signals having frequencies outside of the certain frequency range.

14. The apparatus of claim 11, wherein the push-pull amplification circuitry and the T-network form an amplifier, and wherein the apparatus includes a frequency-divider circuit to drive the push-pull amplification circuitry at the one or more selected frequencies within a certain frequency range and further includes a bandpass filter that is coupled to an output of the amplifier and that blocks signals having frequencies outside of the certain frequency range.

15. The apparatus of claim 11, wherein the variable impedance circuit is variable in order to adjust the resonance frequency, and the one or more selected frequencies are within a certain frequency range that is limited by variable constraints of the variable impedance circuit.

16. The apparatus of claim 11, wherein the push-pull amplification circuitry and the T-network form an amplifier, the push-pull amplification circuitry is to be driven at the one or more selected frequencies within a certain frequency range, and the apparatus further includes:
   a bandpass filter that is coupled to an output of the amplifier and that blocks signals having frequencies outside of the certain frequency range;
   a loading circuit; and
   a matching network arranged between the loading circuit and the bandpass filter.

17. An apparatus comprising:
   push-pull amplification circuitry to be driven at one or more selected frequencies by out-of-phase input signals; and
   a T-network, coupled to the push-pull amplification circuitry and including a variable impedance circuit to be adjusted in accordance with the one or more selected frequencies to set a resonance frequency of the T-network and to shunt a second harmonic current associated with the resonance frequency, wherein the push-pull amplification circuitry and the T-network form a class-EF2 amplifier circuit in which the T-network is to provide zero-voltage-switching and to shunt the second harmonic current.

18. The apparatus of claim 17, wherein by providing the zero-voltage-switching and shunting the second harmonic current, the class-EF2 amplifier circuit is to shape the out-of-phase input signals by providing a shaped oscillating output signal.

19. A circuit amplification method for use with push-pull amplification circuitry having a T-network coupled to the push-pull amplification circuitry, the method comprising:
   driving the push-pull amplification circuitry at one or more selected frequencies by out-of-phase input signals; and
   adjusting or changing a variable impedance circuit, that includes a variable component, as part of the T-network to alter, in accordance with the one or more selected frequencies, a resonance frequency associated with the T-network and cause a second harmonic current associated with the resonance frequency to be shunted.

20. The method of claim 19, wherein the push-pull amplification circuitry and the T-network form an amplifier, and further including driving the push-pull amplification circuitry at a first selected frequency and at a second selected frequency, the first and second selected frequencies being within a certain frequency range that is associated with a bandpass filter that is coupled to an output of the amplifier and that blocks signals having frequencies outside of the certain frequency range.

* * * * *